United States Patent [19]

Eitan et al.

[11] Patent Number: 4,577,295
[45] Date of Patent: Mar. 18, 1986

[54] HYBRID E² CELL AND RELATED ARRAY

[75] Inventors: Boaz Eitan, Sunnyvale; Avi Kolodny, Cupertino; Daniel Amrany, Sunnyvale; James McCreary, Los Gatos, all of Calif.

[73] Assignee: Intel Corporation, Santa Clara, Calif.

[21] Appl. No.: 499,198

[22] Filed: May 31, 1983

[51] Int. Cl.⁴ .............................................. G11C 13/00
[52] U.S. Cl. .................................... 365/218; 365/189
[58] Field of Search ................ 365/218, 189, 230, 182

[56] References Cited
U.S. PATENT DOCUMENTS
4,435,790  3/1984  Tickle et al. ........................ 365/218

Primary Examiner—Terrell W. Fears
Attorney, Agent, or Firm—Blakely, Sokoloff, Taylor & Zafman

[57] ABSTRACT

An improved MOS E² cell is described which includes a floating gate and a thin oxide region. Charge injected into the substrate is used to program the floating gate by hot electron injection through the tunnel oxide region. Erasing is accomplished by tunneling through the thin oxide region. With this arrangement, the capacitance coupling between the floating gate and control gate is greatly reduced, allowing the cell to be substantially smaller. Several novel inhibit modes permit the fabrication of an array without using a selection device for each of the cells.

12 Claims, 5 Drawing Figures

HYBRID E[2] CELL AND RELATED ARRAY

BACKGROUND OF THE INVENTION

1. Field of the Invention

The invention relates to the field of electrically programmable and electrically erasable metal-oxide-semiconductor (MOS) memory cells.

2. Prior Art

Numerous read-only memories employing floating gate memory cells are well-known and commercially available. Typically, these memories are fabricated with MOS technology. Each cell includes a polycrystalline silicon (polysilicon) floating gate which is completely surrounded by insulation such as silicon dioxide. Various mechanisms are used to transport charge onto the floating gate and to remove the charge from this gate. In one class of memories (EPROMs), charge is transported to the floating gate through channel injection or avalanche injection and is removed by exposing the memory to ultraviolet radiation. More recently, memories have become available which may be electrically programmed and electrically erased (E2PROMs). Currently, the most successful commercial version of this memory employs a thin oxide region. Charge is tunnelled onto and from the floating gate through this thin oxide region. This cell (which includes a selection transistor and E2device) is described in U.S. Pat. No. 4,203,158. Memory circuits for using these cells in an arrangement which permits erasing of single words in an array is described in U.S. Pat. No. 4,266,283.

There are a number of difficulties with the prior art cell which are overcome by the present invention. First, to program the E[2] device, relatively large capacitive coupling is required between the floating gate and the overlying control gate. This coupling is necessary to obtain a sufficient field at the thin oxide region to tunnel charge onto the floating gate from the substrate. To obtain this coupling, relatively large areas are required between the floating gate and the overlying control gate. Secondly, in a typical memory array using E[2] devices such as the Intel 2816, selection device (a field-effect transistor) is coupled in series with each E[2] device. The selection device is used to isolate the E[2] device when, for instance, neighboring devices are being read. During the reading of data in a memory cell, a potential is applied to the control gate of the cell. While this potential is substantially less than the porgramming potential, nonetheless, some slow programming can occur because of the large capacitive coupling discussed above. The selection device is used to isolate the cells and prevent this slow programming. This selection device; however, is mainly required to isolate the E[2] device during programming.

As will be seen with the present invention, a different mechanism is used to program the E[2] devices, permitting the capacitive coupling between the control gate and floating gate to be reduced and consequently the substrate area required for each cell may be decreased. Also, since this coupling is reduced, the slow programming problem described above is greatly lessened, making possible single device E[2] cells, that is, cells without the selection devices.

A new mechanism for charging particularly EPROM cells has recently been discovered. With this mechanism, excess charge such as electrons are injected from a junction or other source into a substrate. The potential on a control gate and source/drain terminals of a memory cell causes these excess electrons to accelerate toward the interface between the floating gate and substrate. Some of the electrons gain sufficient energy to surmount the barrier and are injected through the oxide separating the floating gate and substrate, remaining trapped on the floating gate. One advantage to this technique is that a single source of electrons or other charge may be shared by a plurality of cells. This technique allows the reduction in cell geometry and reduction in programming potentials.

There has been some discussion of using this "excess charge" technique for programming E[2] devices. However, it had previously been believed that charge should be removed from the floating gate through avalanche injection employing a series of pulses. The advantages to be gained by the present invention when using tunnelling for removing the charge was not understood or recognized.

This injection technique is described in British Patent Application No. 8233041, filed Nov. 19, 1982.

SUMMARY OF THE INVENTION

An MOS integrated circuit, electrically programmable and electrically erasable memory cell arrangement formed on a silicon substrate is described. The memory cell includes a pair of spaced-apart regions disposed in the substrate and a floating gate disposed above the substrate generally between the spaced-apart regions. The floating gate is insulated from the substrate by a first insulative layer having a first thickness. A portion of the floating gate is separated from the substrate by a second insulative layer having a second thickness, the second thickness being thinner than the first thickness. Charge is tunnelled through this thinner insulative layer from the floating gate to the substrate. The memory cell includes a control gate which is disposed above the floating gate, again generally between the spaced-apart regions. The substrate includes injection means for injecting charge into the substrate particularly during the programming of the memory cell. Electrical means coupled to the spaced-apart regions, control gate and injection means are activated for programming the cell such that injected charge is transferred from the substrate through the first insulative layer onto the floating gate. During erasing, the electrical means causes the charge from the floating gate to be tunnelled through the second insulative layer into the substrate. With the described memory arrangement, the substrate area required for this cell can be reduced since less capacitive coupling is required between the control gate and floating gate.

DETAILED DESCRIPTION OF THE PRESENT INVENTION

A memory arrangement employing electrically erasable and electrically programmable memory cells fabricated with MOS technology and injection means for injecting charge into the substrate is described. Electrical means are used to transfer charge onto the floating gate by one mechanism and to remove it by another mechanism (hybrid $E^2$ cell). In the following description, numerous specific details are set forth such as specific oxide thicknesses, etc., to provide a thorough understanding of the present invention. It will be obvious, however, to one skilled in the art that the present invention may be practiced without these specific details. In other instances, well-known circuits and processing has not been described in order not to unnecessarily obscure the present invention.

The present invention is realized employing known MOS technology. As presently preferred, the memory cells of the present invention are n-channel devices fabricated on a p-type monocrystalline substrate having a relatively low concentration of p-type dopant (50 ohm cm.). Floating gates for the memory cells are fabricated from a first layer of polysilicon which in the currently preferred embodiment is doped. A second layer of polysilicon is used for fabricating the control gates as well as other elements in the array. An overlying metal layer (aluminum) is used for interconnections. While silicon dioxide is currently preferred, other insulative layers for providing insulation between the substrate and floating gate and between the floating gate and control gate may be used. These insulative layers may employ nitridized oxide layers.

Figure 1:
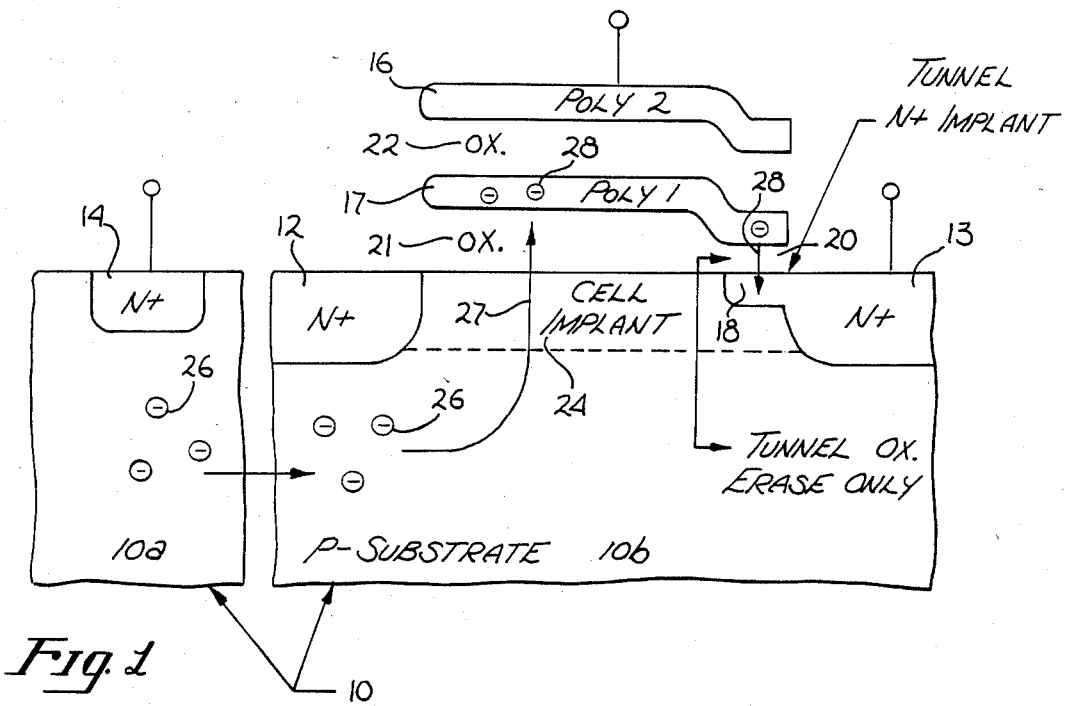
FIG. 1 is a cross-sectional elevation view of two sections of a substrate, one of which includes an E[2] device and the other a charge injector.

Referring first to FIG. 1, sections 10a and 10b of a p-type silicon substrate 10 are illustrated. In the cross-sectional view, the $E^2$ device shown on substrate section 10b includes a pair of spaced-apart, n+ regions 12 and 13. The channel region of the cell is ion implanted as indicated by region 24 to adjust the threshold voltage of the cell as is well-known and often done. The floating gate 17 which is fabricated from polysilicon, as mentioned, is disposed generally above the spaced-apart regions 12 and 13. The gate 17 is insulated from the substrate in part by a first insulative layer 21. In the presently preferred embodiment, the silicon dioxide layer 21 is between approximately 250A–300A thick. A portion of the floating gate 17 is insulated from the substrate by a second, thinner, silicon dioxide layer 20. In the presently preferred embodiment, this layer is approximately 100A thick; however, a thicker layer may be employed. It is through the oxide layer 20 that charge is tunnelled from the floating gate 17 into the substrate as indicated by arrow 28. An ion implanted n+ region 18 is disposed beneath the oxide layer 20 and extends into the region 13. A control gate 16 fabricated from the second layer of polysilicon is insulated from the floating gate by a silicon dioxide layer 22 which is grown from the first polysilicon layer. This layer in the presently preferred embodiment, is approximately 400A to 800A thick.

In section 10a of the substrate, a n+ region 14 is employed to generate charge. As described in the above referenced application, a single source of charge (such as region 14) is shared by a plurality of cells. During programming of the cells, the junction defined by the region 14 and substrate is forward biased. (The negative potential used to forward bias the junction may be generated on-chip.) When this junction is forward biased, minority carriers (electrons) are injected into the p-type substrate as shown in FIG. 1 by electrons 26. Other means of injecting charge into the substrate are described in the above-referenced application.

During programming, a positive potential is applied to region 12 and a higher positive "programming" potential to the gate 16. Electrons are then accelerated towards the floating gate 17 and some of these electrons have sufficient energy to reach the floating gate. The path of these electrons is shown by line 27. Note that during programming of the floating gate 17, little or no charge crosses through the thin oxide 20. Region 18 substantially prevents electrons from crossing through the thin oxide. Electrons crossing through this thin oxide as is the case with prior art $E^2$ devices deteriorates this thin oxide, reducing the life of the cell.

To remove electrons from the floating gate 17 (erasing the cell), a positive potential is applied to region 13 and the electrons are tunnelled from the floating gate 17 into the region 18 and then to region 13.

It should be noted that during the charging of the floating gate, since tunnelling is not employed, the capacitive coupling between the gate 16 and gate 17 may be reduced when compared to prior art $E^2$ devices. This capacitive coupling is not required during discharge from the gate 17 into the substrate.

Figure 2:
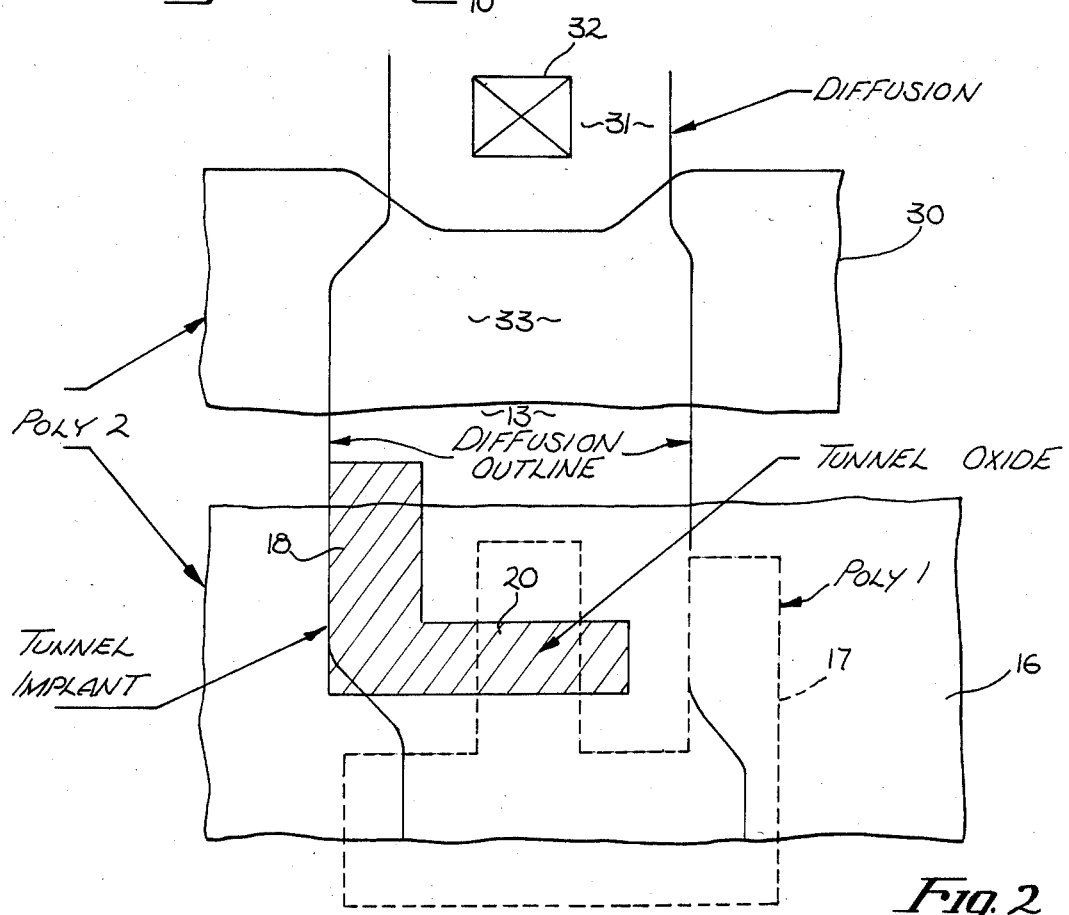
FIG. 2 is a plan view illustrating the layout of the presently preferred embodiment of the memory cell when a selection device is used in the cell.

Referring to FIG. 2, the preferred layout for the cell of FIG. 1 when used with a selection device is illustrated. The selection device is a field-effect transistor, the gate of which is defined by an elongated polysilicon strip 30. The channel region 33 for this transistor lies between the n+ diffusion 31 and the region 13 which is shown in FIG. 1. A metal contact 32 extends to region 31 to connect this region to an overlying metal bit line. The floating gate 17 of FIG. 1 is shown by a broken line in FIG. 2. The ion implanted region 18 (shaded in FIG. 2) is an L-shaped region which intersects a portion of floating gate 17. The tunnel oxide layer 20 is formed at this intersection. The control gate 16 is formed from an elongated polysilicon strip and as is the case with strip 30, it extends over other cells.

Figure 4:
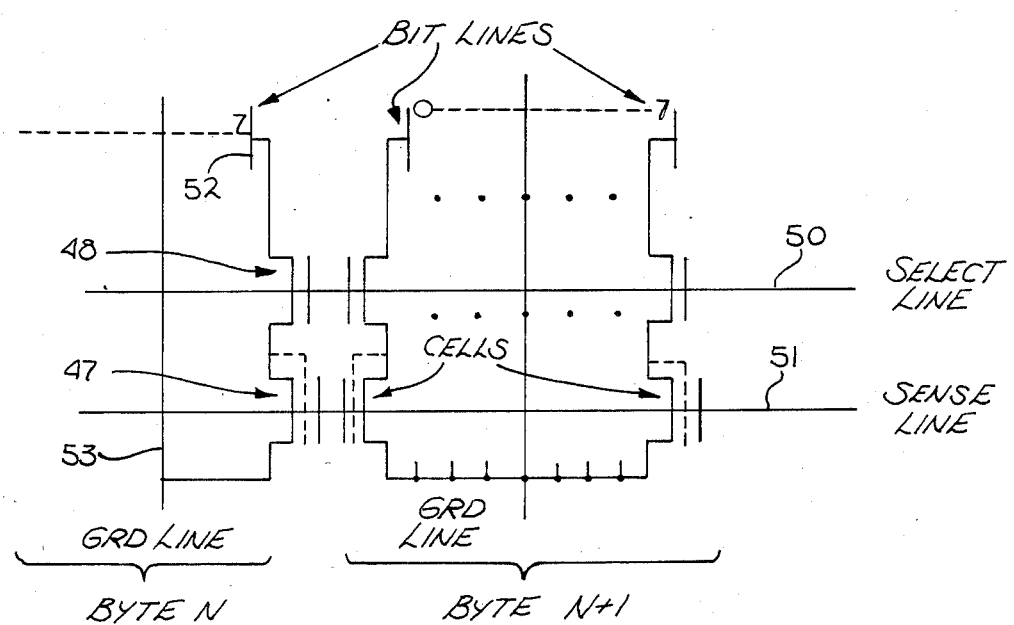
FIG. 4 is a partial electrical schematic of a memory array employing the memory cells of the present invention where selection devices are used in the memory cells.

The cell of FIG. 2 is shown in the partial array of FIG. 4. The $E^2$ device and selection device of FIG. 2 is, for instance, the device 47 and transistor 48 of FIG. 4. These cells and transistor are arranged in groups of 8. Each group of 8 cells are coupled to a common ground line such as ground line 53. One terminal of each of the selection devices is coupled to a bit line in the array; for instance, the drain terminal of transistor 47 is coupled to the bit line 52. This bit line is shown as bit 7 of byte N. In FIG. 4, byte N+1 is illustrated with its bit lines, bit lines 0 through 7. The gates of the selection devices are shown as line 50, this corresponding to the polysilicon strip 30 of FIG. 2; and, the sense lines of the cells are shown as line 51, this corresponding to the polysilicon strip 16 of FIG. 2. The floating gates are shown as broken lines in FIG. 4 with the thin oxide regions being represented by the extension of the broken line into one of the terminals of the $E^2$ devices.

Table 1 below illustrates the potential applied to the various lines in the partial array of FIG. 4 to read, program and erase bit 0 of byte N+1 (cell 54).

TABLE 1

|  | BIT LINE | SELECT LINE | SENSE LINE | GRD LINE | IN-JECTOR |
| --- | --- | --- | --- | --- | --- |
| Read | Read Data | VCC | VCC | Ground | OFF |
| Prog. | Ground | Ground | High | V (Prog.) | ON |
| Erase | V (Erase) | High | Ground | Floating | OFF |

In the above table, $V_{CC}$ is the potential used during normal operation of the memory (e.g., 5 volts), $V_{PROG}$ is the programming potential (e.g., 15 volts), and "High" is a positive potential (e.g., 15 volts). (See the above referenced application for a more detailed discussion of the programming potentials.) During programming, the entire byte is programmed and then the individual bits within the byte are erased to obtain the desired bit pattern for the byte.

In prior art floating gate $E^2$ memories, such as the Intel 2816, an additional transistor and array line is used for each byte to program individual bytes in the memory. This is not required with the invented memory cells.

For the above-described cell (with its selection device), an area of approximately 120 microns$^2$ is required which is a substantial reduction in substrate area when compared to prior art cells (using the same technology).

Referring now to FIG. 3, once again the polysilicon floating gate is shown in a broken line (line 37). The spaced-apart regions 42 each include a contact (contacts 40 and 41). The ion implanted region 39 is shown as the shaded area 39 with the thin oxide region 38 shown within the ion implanted region 39. These regions correspond to regions 18 and 20, respectively, of FIG. 2. As was the case for the embodiment of FIG. 2, an elongated polysilicon strip 36 forms the control gate. This cell does not employ the selection device. (A substrate area of only approximately 95 microns$^2$ is required; this being a substantial reduction from even the embodiment of FIG. 2.)

Figure 3:
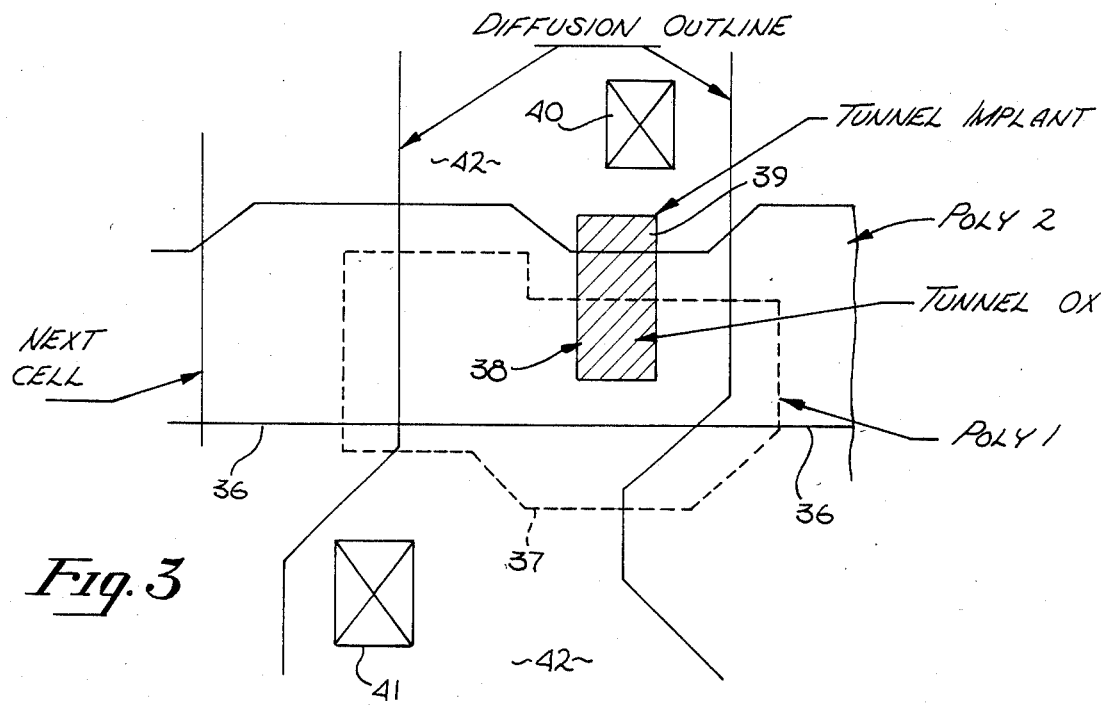
FIG. 3 is a plan view illustrating the layout of the presently preferred embodiment of the memory cell of FIG. 1 when a selection device is not used in the memory cell.
Figure 5:
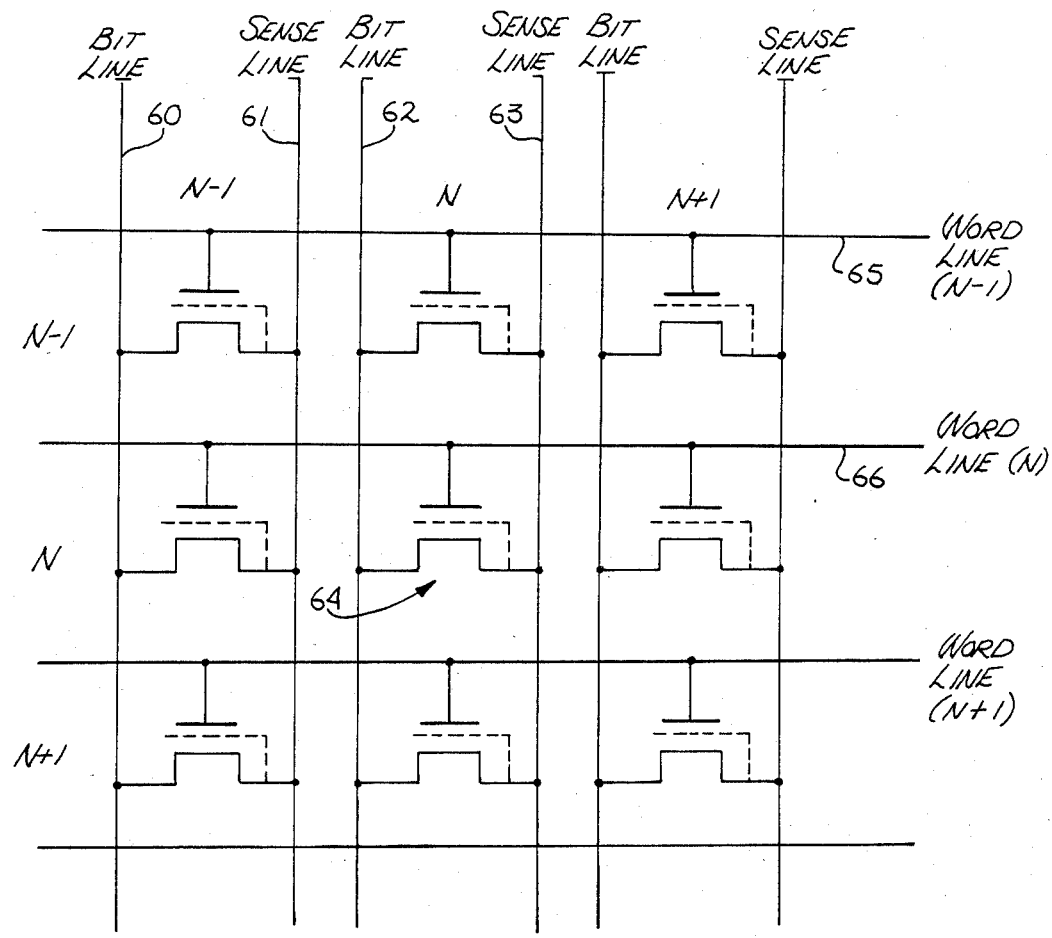
FIG. 5 is a partial electrical schematic of a memory array employing the memory cells of the present invention where selection devices are not used in the memory cells.

A partial memory array employing the cell of FIG. 3 is shown in FIG. 5. A typical cell 64 is shown at location N, N. The spaced-apart terminals of each cell are coupled between a bit line and a sense line such as lines 60 and 61 for column N-1 and lines 62 and 63 for column N. The control gate of each cell is coupled to a word line such as line 65 for the row N-1 and line 66 for the row N. Table 2 below describes the potentials required to read, program and erase cell 64 (N,N).

TABLE 2

|  | BIT LINE | SENSE LINE | WORD LINE | INJECTOR |
| --- | --- | --- | --- | --- |
| READ | Read Data | Ground | VCC | OFF |
| PROG. | V (Prog.) | Floating | HIGH | ON |
| ERASE | Floating | V (Erase) | Ground | OFF |

The bit line N+1 is grounded to provide a source of electrons for programming. This injection mode is described in above-referenced application. All other bit lines are held positive (e.g., VCC).

During programming, some of the cells will have positive control gate potential with grounded drains. The capacitive coupling between the gates is low enough to prevent programming. Some cells will have positive gate potentials and positive drain potentials. Tunnelling is avoided both ways since this case is very similar to the zero gate and zero drain potential. It is important, however, to increase the control gate voltage before the drain voltage is increased to avoid erasing while the voltages are ramped up. In some cases, a positive potential is supplied to the drain with the control gate grounded, tunnelling is avoided since the drain voltage is low enough to prevent erasing.

In addition to the advantages mentioned above, for the same tunnelling threshold voltage used during erase, the tunnel oxide may be thicker thus improving reliability. Since the hot electron injection is used for programming at relatively low field levels through the thicker oxide, the tunnel oxide is not damaged during programming as is often the case with prior art cells. The lower acceptable capacitive coupling between the control gate and floating gate places fewer restraints on the poly-to-poly oxide and therefore this oxide can be thicker.

Thus, an improved floating gate $E^2$ cell has been described. The cell can be fabricated with known MOS technology.

We claim:

1. An MOS integrated circuit, electrically programmable and electrically erasable memory cell arrangement formed on a substrate comprising:
   a memory cell including;
   (i) a pair of spaced-apart regions disposed in said substrate;
   (ii) a floating gate disposed at least between said spaced-apart regions, said floating gate being insulated from said substrate by a first insulative layer and a portion of said floating gate being insulated from said substrate by a second insulative layer through which charge is tunnelled from said floating gate to said substrate, said second insulative layer being thinner than said first insulative layer;
   (iii) a control gate disposed at least between said spaced-apart regions, said control gate being disposed above and insulated from said floating gate;
   injection means for injecting charge into said substrate during the programming of said cell; and
   electrical means coupled to said spaced-apart regions, control gate and injection means for programming said cell such that said injected charge is transferred from said substrate through said first insulative layer onto said floating gate and for erasing said cell such that charge from said floating gate is tunnelled through said second insulative layer into said substrate,
   whereby the area of said substrate required for said cell may be reduced since the capacitive coupling between said floating gate and said control gate may be reduced.

2. The memory cell arrangement defined by claim 1 wherein a plurality of said memory cell share one of said injection means.

3. The memory cell arrangement defined by claim 2 wherein said floating gate and said control gate are polysilicon gates.

4. The memory cell arrangement defined by claim 3 wherein said second insulative layer is disposed above and ion implanted substrate region which is contiguous with one of said spaced-apart regions.

5. The memory cell arrangement defined by claim 4 wherein said injection means comprises a doped substrate region.

6. The memory cell arrangement defined by claim 1 or 5 wherein a plurality of memory cells are disposed in a memory array with one of said spaced-apart regions for each of said memory cells being coupled to a transistor, the gates of said transistors forming select lines in said array, and wherein said other of said spaced-apart regions for each of said memory cells is coupled to ground lines.

7. The memory cell arrangement defined by claim 1 or 5 wherein a plurality of said memory cells are disposed in a memory array with one of said spaced-apart regions for each of said memory cells being coupled to a bit line in said array and the other of said spaced-apart regions for each of said memory cells being coupled to another line in said array with said control gates of said memory cells forming select lines in said array.

8. In an electrically programmable and electrically erasable MOS memory array formed on a substrate which includes a plurality of memory cells each of which has a pair of spaced-apart regions, a floating gate and a control gate where a portion of said floating gates are insulated from said substrate by a thin insulative region through which charge is tunnelled, and where the remainder of said floating gate is insulated from said substrate by a thicker insulative layer, an improvement comprising:

injection means for injecting minority carriers into said substrate;

electrical means coupled to said spaced-apart regions, control gates and injection means for transferring injected charge from said substrate to said floating gate through said thicker insulative layer to program said cells and for tunnelling charge from said floating gate through said thin insulative layer into said substrate to erase said cells;

whereby an improved erasable MOS memory array is realized.

9. The array defined by claim 8 wherein said substrate is a p-type silicon.

10. The array defined by claim 9 wherein said insulative layers comprise silicon dioxide layers.

11. The array defined by claim 8 wherein one of said injection means is shared by a plurality of cells.

12. The array defined by claim 11 wherein each of said injection means comprises a doped substrate region.

* * * * *